(12) United States Patent (10) Patent No.: US 11,506,973 B2
Yoshida (45) Date of Patent: Nov. 22, 2022

(54) IMPRINT APPARATUS, IMPRINTING METHOD, AND ARTICLE MANUFACTURING METHOD

(71) Applicant: CANON KABUSHIKI KAISHA, Tokyo (JP)

(72) Inventor: Kenji Yoshida, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 103 days.

(21) Appl. No.: 16/817,306

(22) Filed: Mar. 12, 2020

(65) Prior Publication Data

US 2020/0292935 A1 Sep. 17, 2020

(30) Foreign Application Priority Data

Mar. 14, 2019 (JP) .............................. JP2019-047613

(51) Int. Cl.
*G03F 7/22* (2006.01)
*G03F 7/00* (2006.01)
*H01L 21/027* (2006.01)
*G03F 7/022* (2006.01)

(52) U.S. Cl.
CPC ............ *G03F 7/0002* (2013.01); *G03F 7/002* (2013.01); *G03F 7/0022* (2013.01); *G03F 7/022* (2013.01); *H01L 21/0273* (2013.01)

(58) Field of Classification Search
None
See application file for complete search history.

(56) References Cited

U.S. PATENT DOCUMENTS

2017/0307367 A1\* 10/2017 Yaegashi ................ G02B 27/60

FOREIGN PATENT DOCUMENTS

| JP | 2013-69918 A | 4/2013 |
|---|---|---|
| JP | 2014-3138 A | 1/2014 |
| JP | 2017-139257 A | 8/2017 |

\* cited by examiner

*Primary Examiner* — Jacob T Minskey
*Assistant Examiner* — Adrien J Bernard
(74) *Attorney, Agent, or Firm* — Canon U.S.A., Inc. IP Division (57) ABSTRACT

An imprint apparatus that forms a pattern of an imprint material on a substrate using a mold having a pattern formation area. The imprint apparatus includes a mold measurement unit configured to measure a position of the pattern formation area of the mold, a light modulation element configured to control an intensity distribution of irradiation light applied to the substrate, an irradiation light measurement unit configured to measure a position of the irradiation light, and a control unit configured to control the position of the irradiation light with respect to the position of the pattern formation area based on a measurement result of the position of the pattern formation area by the mold measurement unit and a measurement result of the position of the irradiation light by the irradiation light measurement unit.

10 Claims, 8 Drawing Sheets

IMPRINT APPARATUS, IMPRINTING METHOD, AND ARTICLE MANUFACTURING METHOD

BACKGROUND

Field of the Disclosure

The present disclosure relates to an imprint apparatus for forming an imprint material pattern on a substrate using a mold, an imprinting method, and an article manufacturing method.

Description of the Related Art

There is known an imprinting method for forming a pattern of an imprint material on a substrate using a mold as a method for manufacturing an article such as a semiconductor device or micro-electromechanical system (MEMS). In the imprinting method, an imprint material is supplied onto a substrate, and the supplied imprint material is brought into contact with a mold (imprinting). After the imprint material is cured in a state in which the imprint material and the mold are in contact with each other, the mold is then separated from the cured imprint material (mold release) to form a pattern of the imprint material on the substrate.

In the imprint apparatus, pressing force is applied to the imprint material and the mold when the imprint material supplied to a shot area on the substrate is brought into contact with the mold. Thus, the imprint material moves to spread outside the shot area. At this time, there is a possibility that the imprint material extrudes outside the shot area or substrate edge, or outside a pattern area of the mold.

Japanese Patent Application Laid-Open No. 2013-69918 discusses a technique that applies ultraviolet (UV) light to the outside of a pattern formation area to cure imprint material that is about to extrude outside the pattern formation area, when the imprint material supplied to a shot area on a substrate is brought into contact with a mold. Thereby, the imprint apparatus discussed in Japanese Patent Application Laid-Open No. 2013-69918 prevents the imprint material from extruding outside the pattern formation area.

In the imprint apparatus, it is necessary to accurately apply UV light to the outer peripheral position of the pattern formation area to cure the imprint material that is about to extrude outside the pattern formation area. For this necessity, there is considered a method by which to form an irradiation pattern of UV light via a spatial light modulation element such as a digital mirror device (DMD) to apply UV light to the position of the pattern formation area.

However, the extrusion of the imprint material may not be reduced if the pattern formation area of the mold is displaced from the irradiation position of the UV light from the spatial light modulation element due to the influence of conveyance error of the mold.

SUMMARY

According to an aspect of the present invention, an imprint apparatus is an imprint apparatus that forms a pattern of an imprint material on a substrate using a mold having a pattern formation area. The imprint apparatus includes a mold measurement unit configured to measure a position of the pattern formation area of the mold, a light modulation element configured to control an intensity distribution of irradiation light applied to the substrate, an irradiation light measurement unit configured to measure a position of the irradiation light, and a control unit configured to control the position of the irradiation light with respect to the position of the pattern formation area, based on a measurement result of the position of the pattern formation area by the mold measurement unit and a measurement result of the position of the irradiation light by the irradiation light measurement unit.

Further features of the present invention will become apparent from the following description of exemplary embodiments with reference to the attached drawings.

DESCRIPTION OF THE EMBODIMENTS

Hereinafter, preferred exemplary embodiments of the present invention will be described in detail with reference to the attached drawings. In the drawings, the same components will be given the same reference numbers and duplicated descriptions thereof will be omitted.

Figure 1:
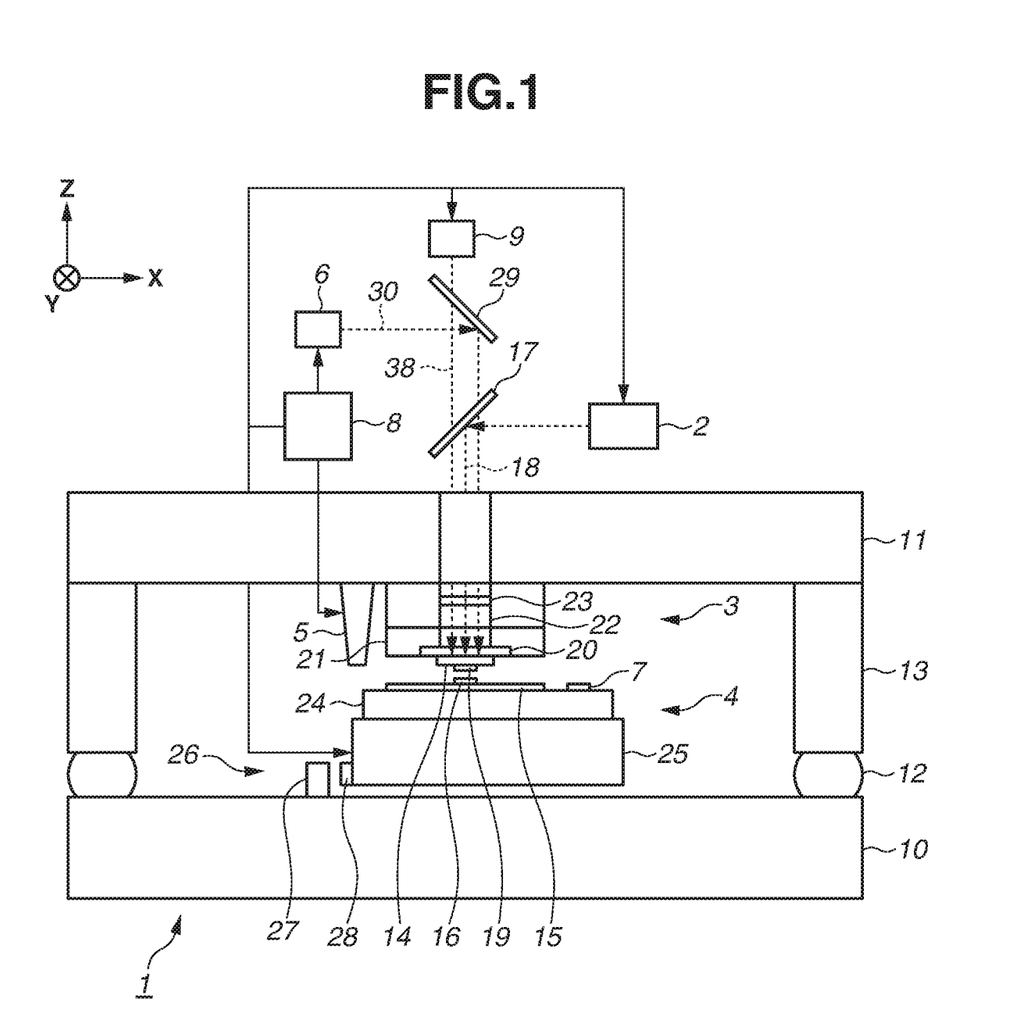
FIG. 1 is a block diagram of an imprint apparatus.

FIG. 1 is a schematic diagram illustrating a configuration of an imprint apparatus 1 according to a first exemplary embodiment. The configuration of the imprint apparatus 1 will be described with reference to FIG. 1. In the embodiment, axes are determined as illustrated in FIG. 1, where the plane on which a substrate 15 is located is an XY plane and a direction orthogonal to the XY plane is a Z direction. The imprint apparatus 1 brings an imprint material 16 supplied on the substrate into contact with a mold 14. The imprint apparatus 1 then applies energy for curing to the imprint material, thereby forming a pattern of a cured product to which a concave-convex pattern of the mold has been transferred. The imprint apparatus 1 illustrated in FIG. 1 is used for manufacturing a device such as a semiconductor device as an article. In the embodiment, the imprint apparatus 1 employing a light curing method will be described.

As the imprint material 16, a curable composition is used. The curable composition, which may also be referred to as an uncured resin, cures when energy for curing is given. As the energy for curing, an electromagnetic wave, heat, or the like is used. The wavelength of the electromagnetic wave is selected from a range of, for example, 10 nm to 1 mm, and lights including infrared rays, visible rays, and ultraviolet rays are used.

The curable composition is a composition that cures by light irradiation or by heating. A photocurable composition that is cured by light irradiation contains at least a polymerizable compound and a photopolymerization initiator, and may contain a non-polymerizable compound or a solvent as necessary. The non-polymerizable compound is at least one selected from a group including a sensitizer, a hydrogen donor, an internal release agent, a surfactant, an antioxidant, and a polymer component.

The imprint material 16 may be applied on the substrate in the form of a film by a spin coater or a slit coater. The imprint material may be applied, by a liquid ejecting head, onto the substrate in the form of droplets, or in the form of islands or films formed by a plurality of droplets connected together. The viscosity of the imprint material (e.g., viscosity at 25° C.) is, for example, from 1 mPa·s to 100 mPa·s.

Glass, ceramics, metal, semiconductor, resin, or the like is used for the substrate 15. A component made of a material different from the substrate may be formed on the surface as necessary. Specifically, a silicon wafer, a compound semiconductor wafer, quartz glass, and the like are used for the substrate 15.

The imprint apparatus 1 according to present exemplary embodiment employs a light curing method as a method for curing the imprint material. As illustrated in FIG. 1, a direction, which is parallel to an optical axis of an exposure irradiation unit irradiating light to the imprint material 16 on the substrate 15 (e.g., the direction in which the mold 14 is pressed against the imprint material 16), is Z axis. The directions orthogonal to each other in a plane perpendicular to the Z axis are X axis and Y axis.

The imprint apparatus 1 includes a curing light irradiation unit 2, a mold holding mechanism 3, a substrate stage 4, a jetting unit 5, a pattern light irradiation unit 6, a sensor unit 7, a control unit 8, and an alignment measurement unit 9. The imprint apparatus 1 also includes a base plate 10 on which the substrate stage 4 is placed, a bridge plate 11 that fixes the mold holding mechanism 3, and a column 13 that is extended from the base plate 10 and supports the bridge plate 11 via a vibration isolator 12. The vibration isolator 12 reduces (removes) vibration transmitted from the floor surface to the bridge plate 11. The imprint apparatus 1 further includes a mold conveyance unit (not illustrated) and a substrate conveyance unit (not illustrated). The mold conveyance unit conveys the mold 14 from the outside of the imprint apparatus 1 to the mold holding mechanism 3. The substrate conveyance unit conveys the substrate 15 from the outside of the imprint apparatus 1 to the substrate stage 4.

The curing light irradiation unit 2 irradiates the imprint material 16 on the substrate 15 with curing light 18 through a dichroic mirror 17 and the mold 14 in the imprinting process. The curing light irradiation unit 2 includes, for example, a light source and an optical element that adjusts the curing light 18 emitted from the light source in a manner suitable for the imprinting process. In the present exemplary embodiment, a case where ultraviolet rays are applied as the curing light 18 will be described.

The mold 14 is configured to mold the imprint material 16 placed on the substrate 15. The mold is also be called a template or an original. The mold 14 has a polygonal (e.g., rectangular) outer shape and has a pattern part (pattern formation region) 19 on which a pattern (e.g., concave-convex pattern) to be transferred to (the imprint material 16 of) the substrate 15 is formed. The pattern part 19 (also referred to as a mesa part) extrudes from the periphery near the center on the surface of the mold 14 facing the substrate 15. The pattern part 19 has the concave-convex pattern, such as a circuit pattern to be transferred to the substrate 15, formed in a three-dimensional shape. The mold 14 is made of a material, such as quartz, that can transmit the curing light 18. The mold 14 also has a cavity (concave) for facilitating deformation of the mold 14 (pattern part 19) on a surface opposite to a surface facing the substrate 15 (e.g., a surface on an incident side of the curing light 18). The cavity provided in the mold 14 has a circular planar shape, and the depth of the cavity is appropriately set according to the size or material of the pattern part 19. The pattern part 19 of the mold 14 has an alignment mark to be used for alignment.

The mold holding mechanism 3 includes a mold holding unit 20 that holds the mold 14, and a mold driving unit 21 that holds the mold holding unit 20 and moves the mold 14 (mold holding unit 20).

The mold holding unit 20 holds the mold 14 by attracting the outermost area of the surface on the incident side of the curing light 18 of the mold 14 by vacuum suction force or electrostatic force. For example, in a case where the mold holding unit 20 holds the mold 14 by vacuum suction force, the mold holding unit 20 is connected to an externally installed vacuum pump, and switching takes place between attachment and detachment (e.g., holding and releasing) of the mold 14 by the vacuum pump turning on and off.

The mold driving unit 21 moves the mold 14 in the Z-axis direction to press the mold 14 against the imprint material 16 on the substrate 15 (imprinting process) or to separate the mold 14 from the imprint material 16 on the substrate 15 (releasing process). The actuator applicable to the mold driving unit 21 includes a linear motor, and an air cylinder. The mold driving unit 21 may include a plurality of drive systems, such as a coarse drive system and a fine drive system, for high-accuracy positioning of the mold 14. The mold driving unit 21 may be configured to move the mold 14 not only in the Z-axis direction but also in the X-axis direction and the Y-axis direction. The mold driving unit 21 may have a tilt function for adjusting the position of the mold 14 in a rotation direction (OZ direction) around the Z axis, and the inclination of the mold 14 (a rotation direction around the X axis and a rotation direction around the Y axis).

The imprint apparatus 1 may perform the imprinting process and the releasing process by moving the mold 14 in the Z-axis direction as described in the present exemplary embodiment, or by moving the substrate 15 (substrate stage 4) in the Z-axis direction. Otherwise, the imprint apparatus 1 may perform the imprinting process and the releasing process by relatively moving both the mold 14 and the substrate 15 in the Z-axis direction.

The mold holding unit 20 and the mold driving unit 21 have an opening 22 at the center (inside) so that the curing light 18 from the curing light irradiation unit 2 is applied to the imprint material 16 placed on the substrate 15. A light transmission element 23, which transmits the curing light 18, is placed in the opening 22 to seal space surrounded by a portion of the opening 22 and the mold 14. Pressure in the sealed space is adjusted by a pressure regulator such as a vacuum pump. For example, the pressure regulator makes the pressure in the sealed space higher than the external pressure, when the imprint material 16 on the substrate 15 and the mold 14 come into contact with each other (e.g., during the imprinting process). Thus, the pattern part 19 of the mold 14 becomes bent (deformed) toward the substrate 15 in a convex shape. Accordingly, the pattern part 19 of the mold 14 can be brought into contact with the imprint material 16 on the substrate 15 from near the center of the pattern part 19. Making contact from the center to the outside of the pattern part 19 in this way makes it possible to reduce residual air between the mold 14 and the imprint material 16. Thus, the imprint material 16 can be charged into every corner of the pattern part 19 (e.g., concave) of the mold 14. The imprint apparatus 1 cures the imprint material 16 by applying the curing light 18 in a state where the pattern part 19 of the mold 14 and the imprint material 16 on the substrate 15 are in contact with each other. Thereby, the pattern of the mold 14 is transferred to the imprint material 16 on the substrate 15.

The substrate stage 4 includes a substrate holding unit 24 that holds the substrate 15, and a stage driving unit 25 that holds the substrate holding unit 24 and moves the substrate 15 (substrate holding unit 24) in each axial direction. The substrate stage 4 holds the substrate 15, and can move the substrate 15 to adjust positions of the mold 14 and the substrate 15 when the imprint material 16 on the substrate 15 and the mold 14 come into contact with each other.

The substrate holding unit 24 holds the substrate 15 by attracting a back surface of the substrate 15 by vacuum suction force or electrostatic force. In a case where the substrate holding unit 24 holds the substrate 15 by, for example, vacuum suction force, the substrate holding unit 24 is connected to an externally installed vacuum pump. Thereby, switching between attachment and detachment (holding and releasing of holding) of the substrate 15 is driven by the vacuum pump turning on and off.

The actuator applicable to the stage driving unit 25 may be, for example, a linear motor and a planar motor. The stage driving unit 25 may include a plurality of drive systems such as a coarse drive system and a fine drive system in each of the X-axis and Y-axis directions for high-accuracy positioning of the substrate 15. The stage driving unit 25 may be configured to move the substrate 15 not only in the X-axis direction and the Y-axis direction but also in the Z-axis direction. Further, the stage driving unit 25 may have a tilt function for adjusting the position of the substrate 15 in a rotation direction (e.g., OZ direction) around the Z axis or the inclination of the substrate 15 (e.g., a rotation direction around the X axis and a rotation direction around the Y axis).

For the purpose of measuring the position of the substrate stage 4, the imprint apparatus 1 has an encoder system 26 (stage measurement unit) corresponding to each of the X-axis, the Y-axis, and the Z-axis directions. The encoder system 26 can measure the position of the substrate stage 4 by irradiating an encoder scale 28 with a beam emitted from an encoder head 27. The encoder system 26 measures the position of the substrate stage 4 in real time.

The jetting unit 5 (dispenser) is disposed in the vicinity of the mold holding mechanism 3, and supplies (applies) the uncured imprint material 16 (also referred to as uncured resin) to the substrate 15. The imprint material 16 according to the present exemplary embodiment is an ultraviolet curable resin material having a property of being cured when irradiated with ultraviolet rays as the curing light 18. The imprint material 16 is selected according to various kinds of information such as a manufacturing process of a semiconductor device. The supply amount of the imprint material 16 supplied from the jetting unit 5 is determined based on the pattern thickness (residual layer thickness) or density of the imprint material 16 formed on the substrate 15. The jetting unit 5 may be provided outside the imprint apparatus 1. In this case, the imprint material 16 is supplied in advance onto the substrate 15 outside the imprint apparatus 1. The imprint apparatus 1 then performs an imprinting process and a releasing process on the substrate 15 to which the imprint material 16 is supplied, thereby forming a pattern of the imprint material on the substrate 15.

The pattern light irradiation unit 6 irradiates the substrate 15 with pattern light 30 having a target intensity distribution via a dichroic mirror 29. The pattern light irradiation unit 6 will be described in detail with reference to FIG. 2.

Figure 2:
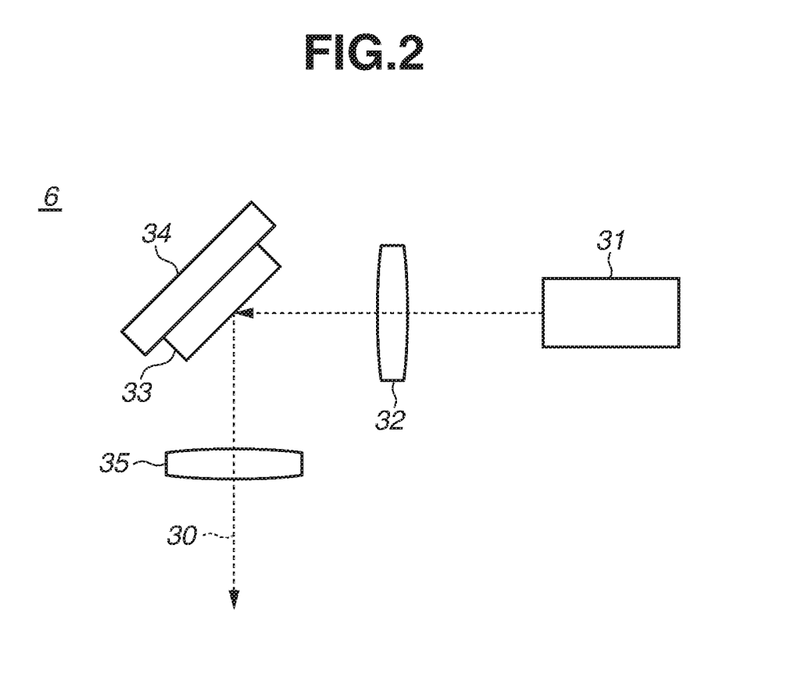
FIG. 2 is a block diagram illustrating a pattern illumination unit according to a first exemplary embodiment.

FIG. 2 is a schematic diagram illustrating a configuration of the pattern light irradiation unit 6. The pattern light irradiation unit 6 includes, for example, a light source 31, an optical element 32, a spatial light modulation element 33, an element driving mechanism 34, and an optical element 35. In the present exemplary embodiment, the light source 31 emits light having a wavelength that cures the imprint material 16 and light having a wavelength that does not cure the imprint material 16. For example, the light source 31 emits light having a wavelength of 400 nm as the light having a wavelength for curing the imprint material 16 and light having a wavelength of 470 nm as the light having a wavelength that does not cure the imprint material 16. The light emitted from the light source 31 is guided by the optical element 32 to the spatial light modulation element 33 that spatially modulates amplitude, phase, or polarization. As the spatial light modulation element 33 (light modulation element), for example, a digital micromirror device (DMD), a liquid crystal display (LCD) device, a liquid crystal on silicon (LCOS) device, or the like is used. By using the spatial light modulation element 33, the illumination area and light intensity of the pattern light 30 applied to the substrate 15 can be set freely. The spatial light modulation element 33 is driven in a direction along the surface of the spatial light modulation element 33 by the element driving mechanism 34. The element driving mechanism 34 can move the whole of a plurality of pixels included in the spatial light modulation element 33 in one direction to change the position of the spatial light modulation element 33 with respect to the imprint apparatus 1. Thereby, the pattern light irradiation unit 6 can adjust the position where the light emitted from the light source 31 hits the spatial light modulation element 33. The light source 31, the spatial light modulation element 33, and the element driving mechanism 34 included in the pattern light irradiation unit 6 are controlled by the control unit 8. The pattern light 30 of which the illumination area and light intensity are controlled by the spatial light modulation element 33 is adjusted by the optical element 35 in the magnification of application to the mold 14 and the substrate 15.

The sensor unit 7 is arranged on the substrate stage 4 so as to be the same in height as the substrate 15 held on the substrate stage 4 (substrate holding unit 24). The sensor unit 7 will be described in detail with reference to FIG. 3.

Figure 3:
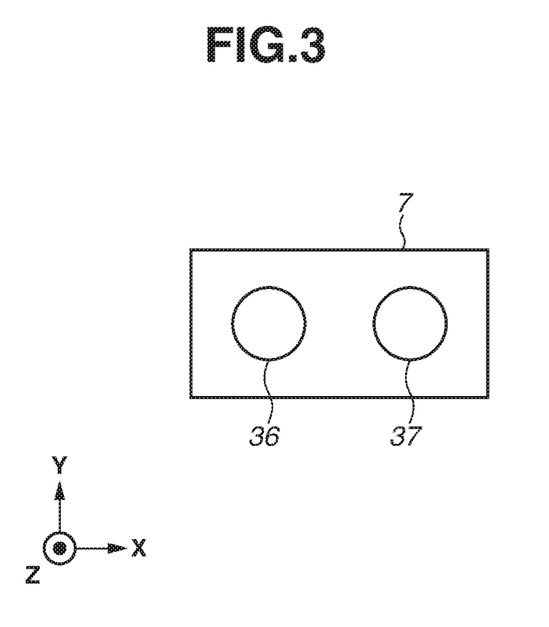
FIG. 3 is a diagram illustrating a sensor unit according to the first exemplary embodiment.

FIG. 3 is a schematic diagram illustrating a configuration of the sensor unit 7. As illustrated in FIG. 3, the sensor unit 7 includes a light detection element 36 and a distance sensor 37. The light detection element 36 measures the amount of light (irradiation amount) of the light applied to the substrate stage 4. In the present exemplary embodiment, the light applied to the substrate stage 4 is the pattern light 30 emitted from the pattern light irradiation unit 6. The light detection element 36 is, for example, a photoelectrical conversion element that outputs an electrical signal based on received light. The light detection element 36 measures the light amount of the pattern light 30 applied to the substrate 15 while being driven by the substrate stage 4 and scanning the region irradiated with the pattern light 30, during a period when the imprinting process is not performed. The light detection element 36 is an irradiation light measurement unit that measures the amount of the pattern light 30 applied to the substrate 15.

The distance sensor 37 can measure the distance from the substrate stage 4 to the surface of the mold 14. The distance sensor 37 is, for example, a laser displacement meter. After the mold 14 is conveyed to the mold holding mechanism 3 of the imprint apparatus 1, the distance sensor 37 can determine the position and orientation of the mold 14 and the outer shape and position of the pattern part 19 provided in the mold 14 by measuring the distance to the mold 14. The distance sensor 37 is a mold measurement unit that can measure the position of the mold.

Figure 4:
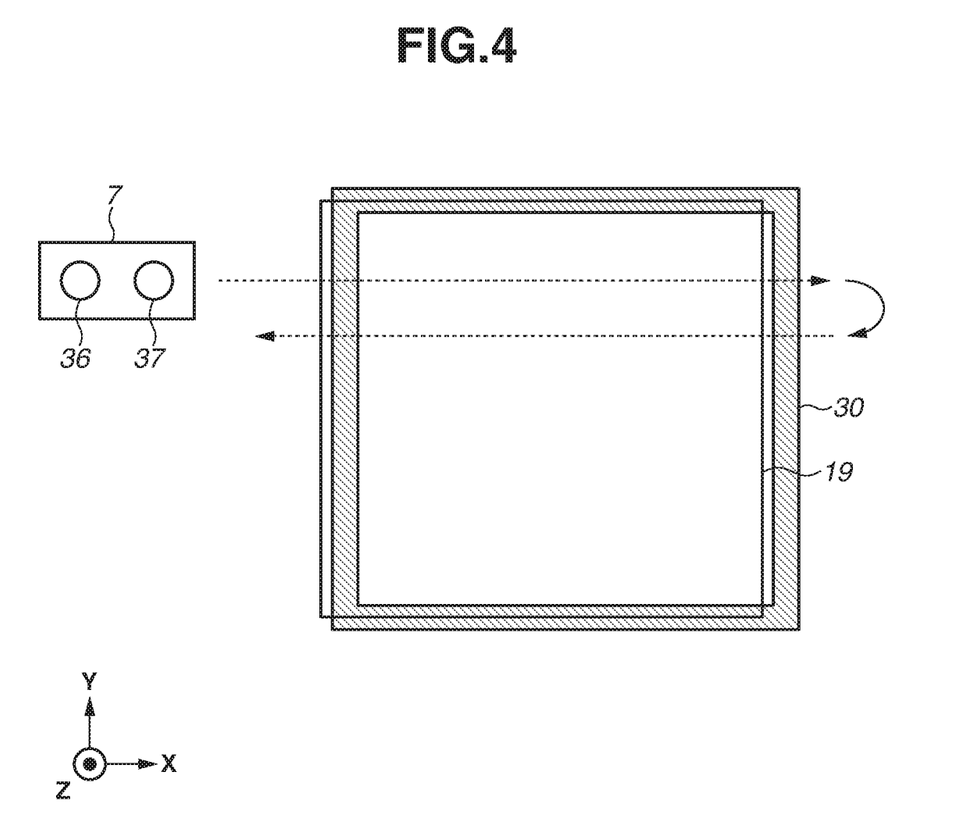
FIG. 4 is a diagram illustrating the sensor unit and a pattern part of a mold according to the first exemplary embodiment.

As illustrated in FIG. 4, the light amount and illumination area of the pattern light 30 can be measured by the light detection element 36 of the sensor unit 7 scanning the substrate 15 in the direction along the surface of the substrate 15 (e.g., direction along the XY plane). Similarly, the position of the pattern part 19 (mesa part) can be measured by the distance sensor 37 of the sensor unit 7 scanning the substrate 15 in the direction along the surface of the substrate 15 to measure the distance to the surface of the mold 14.

The control unit 8 includes a computer having a central processing unit (CPU), a memory, and the like, and controls each unit included in the imprint apparatus 1 according to a program stored in the memory. The control unit 8 controls an imprinting process of forming a pattern on the substrate by controlling operations and adjustments of each unit of the imprint apparatus 1. The control unit 8 can position the substrate stage 4 (the substrate 15 and the sensor unit 7) based on the measurement values of the encoder system 26. In the present exemplary embodiment, the control unit 8 controls the pattern light irradiation unit 6 based on the measurement result of the sensor unit 7. The control unit 8 may be formed integrally with other parts of the imprint apparatus 1 (e.g., in a common casing), or may be formed separately from other parts of the imprint apparatus 1 (e.g., in a separate casing).

When performing the imprinting process, the alignment measurement unit 9 irradiates the mold 14 and the substrate 15 with the alignment light 38, and detects the light from the alignment marks formed on the mold 14 and the substrate 15. Thus, the alignment measurement unit 9 can measure the positions of the mold 14 and the substrate 15.

(About Imprinting Process)

Figure 5:
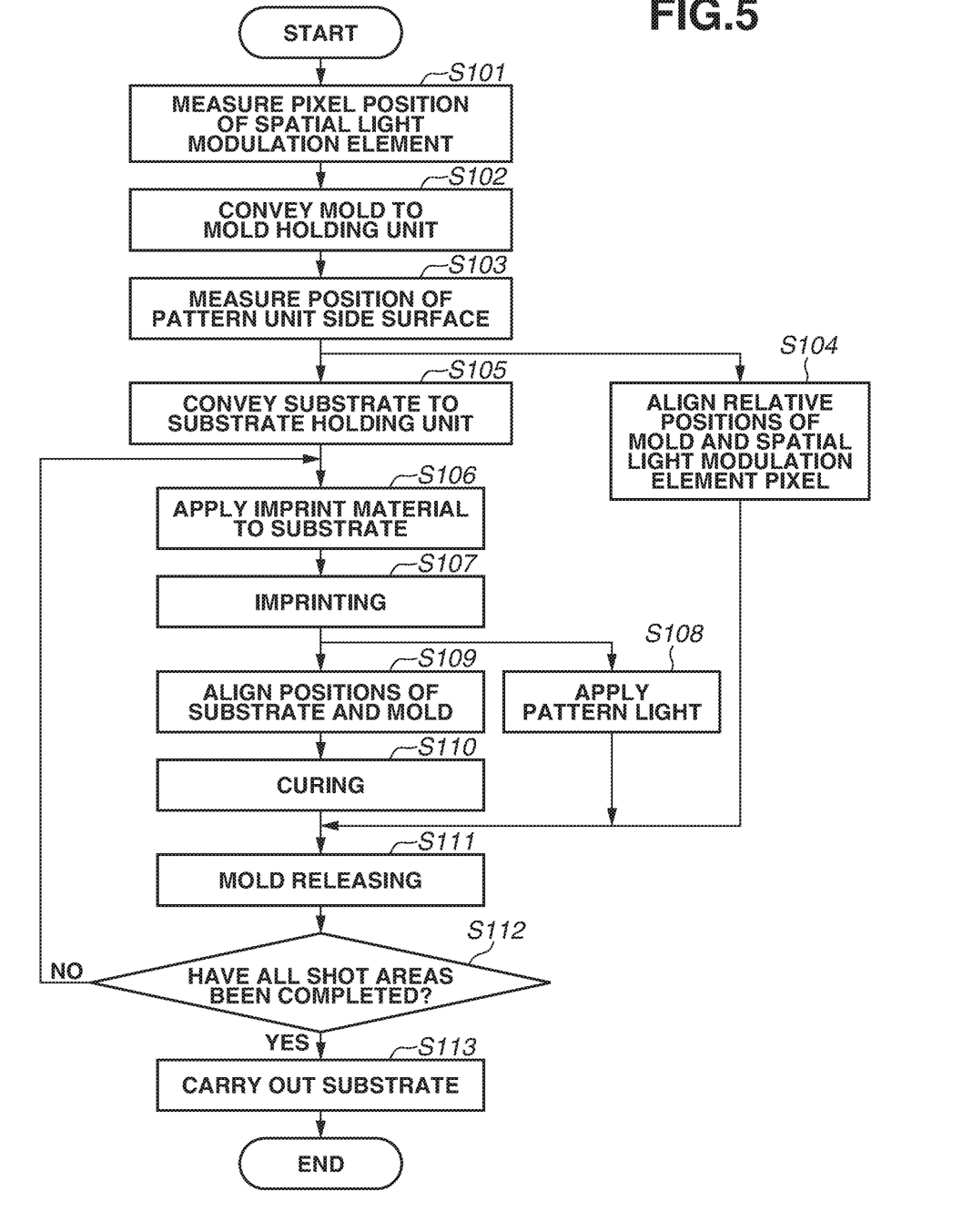
FIG. 5 is a flowchart of an imprinting process according to the first exemplary embodiment.

Next, the imprinting process performed by the imprint apparatus 1 will be described with reference to the flowchart of FIG. 5. FIG. 5 is a flowchart illustrating the imprinting process performed by the imprint apparatus 1.

In step S101, positions of pixels included in the spatial light modulation element 33 are measured (irradiation light measurement step). In step S101, irradiation light having an illumination pattern (illumination area) along the outer periphery (also referred to as a mesa edge) of the pattern part 19 is applied from the pattern light irradiation unit 6 as the pattern light 30. At this time, as illustrated in FIG. 4, a light amount is measured while the substrate stage 4 is driven so that the sensor unit 7 scans under the pattern light 30. The imprint apparatus 1 stores the position of the substrate stage 4 and the positions of the pixels included in the spatial light modulation element 33 having generated the pattern light 30. The position of the substrate stage 4 is a position where the light detection element 36 of the sensor unit 7 has received the pattern light from the spatial light modulation element 33. The imprint apparatus 1 can measure the positions of the pixels included in the spatial light modulation element 33 using this measurement result. In the present exemplary embodiment, irradiation light having an illumination pattern (illumination area) along the outer periphery of the pattern part 19 is used as the pattern light 30. Alternatively, pattern light having another illumination area may be used.

In step S102, the mold 14 is conveyed from the outside of the imprint apparatus 1 to the mold holding mechanism 3 (mold holding unit 20) using the mold conveyance unit.

In step S103, the position of the side surface of the pattern part 19 of the mold 14 (the outer periphery of the pattern part 19) is measured (mold measurement step). In step S103, as illustrated in FIG. 4, the distance from the sensor unit 7 to the mold 14 is measured while the substrate stage 4 is driven so that the distance sensor 37 of the sensor unit 7 scans under the pattern part 19 of the mold 14. Since the pattern part 19 of the mold 14 used in the imprint apparatus 1 extrudes from the surrounding surface by several tens of μm, the position of the side surface of the pattern part 19 can be detected using the amount of change in the measured distance.

In the present exemplary embodiment, the position of the side surface of the pattern part 19 is measured by measuring the distance from the sensor unit 7 to the mold 14 and the pattern part 19. Alternatively, a sensor provided in the mold holding mechanism 3 to measure the distance to an end surface of the mold 14 may be used as a mold measurement unit. The position of the side surface of the pattern part 19 may be detected by measuring the distance from the sensor provided in the mold holding mechanism 3 to the end surface of the mold 14 held by the mold holding mechanism 3.

Step S102 and step S103 may be performed before step S101.

In step S104, the positions of the pixels in the spatial light modulation element 33 determined in step S101 and the relative position of the side surface of the pattern part 19 determined in step S103 are aligned (step of adjusting the position). The distance between the pixel position of the spatial light modulation element 33 and the side surface position of the pattern part 19 is determined from the pixel positions of the spatial light modulation element 33 determined in step S101 and the position of the side surface of the pattern part 19 determined in step S103. One or both of the mold driving unit 21 and the element driving mechanism 34 are driven based on the determined distance.

Figure 6A:
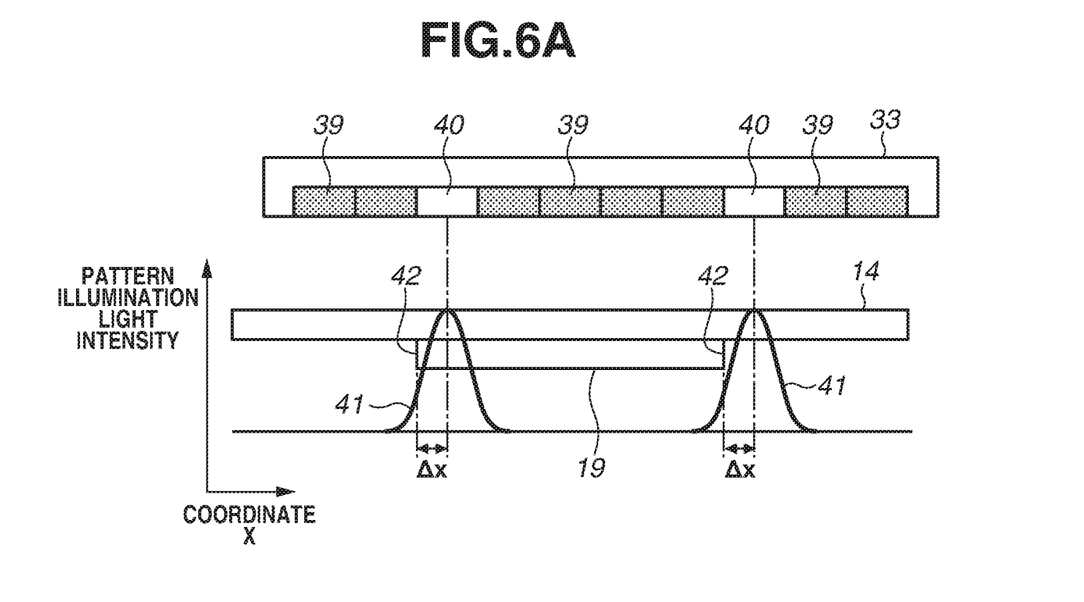
FIGS. 6A and 6B are diagrams illustrating alignment of the mold and the spatial light modulation element according to the first exemplary embodiment.
Figure 6B:
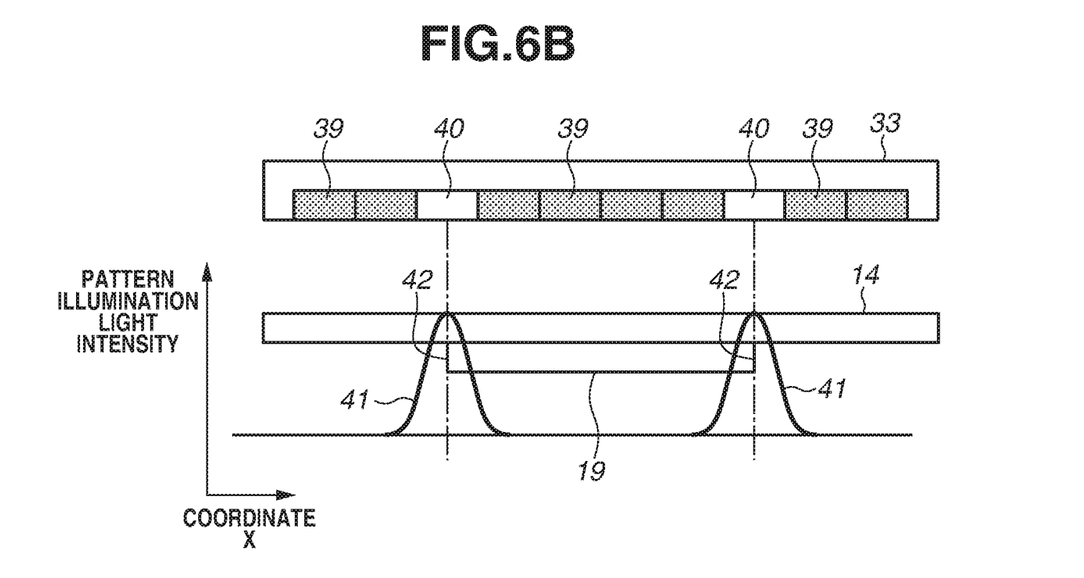

FIGS. 6A and 6B are schematic diagrams for explaining alignment between the mold 14 and the spatial light modulation element 33 in step S104. FIG. 6A illustrates a state in which the mold 14 is conveyed and held by the mold holding unit 20. The light emitted from the light source 31 in the state as illustrated in FIG. 6A is reflected by ON pixels 40 on the spatial light modulation element 33, and forms an intensity distribution 41 of the pattern light 30 on the substrate 15. When the pattern light 30 is applied in the positional relationship between the intensity distribution 41 and the end surfaces 42 of the pattern part 19 (the outer periphery of the pattern part 19) as illustrated in FIG. 6A, the target position (the end surfaces 42 of the part 19) cannot be irradiated with the light.

When the mold 14 (pattern part 19) is greatly displaced with respect to the size of one pixel formed in the spatial light modulation element 33, the pattern light can be applied to the target position by changing the positions of the ON pixels 40. However, the pattern light cannot be applied to the target position only by changing the positions of the ON pixels 40, when the mold 14 is slightly displaced with respect to the size of one pixel in the spatial light modulation element 33 (for example, by less than the size of one pixel on the substrate) as illustrated in FIG. 6A.

For example, the pattern light irradiation unit 6 may apply the pattern light 30 for the purpose of reducing the extrusion of the imprint material 16 from the end surfaces 42 of the pattern part 19 at the time of imprinting. In this case, it is necessary to apply the pattern light 30 according to the end surfaces 42 of the mold 14. When the pattern light 30 having the intensity distribution 41 is applied to the end surfaces 42 of the pattern part 19 illustrated in FIG. 6A, there is a possibility that the imprint material 16 is not applied to the left end surface 42, or the imprint material 16 seeps out at the right end surface 42, or both take place.

In step S104, the imprint apparatus 1 according to the present exemplary embodiment determines a shift amount Δx between the position of the end surfaces 42 of the pattern part 19 and the intensity distribution 41 of the pattern light 30 (pixel positions of the spatial light modulation element 33). Based on the determined deviation amount Δx, the imprint apparatus 1 drives the spatial light modulation element 33 to have the positional relationship as illustrated in FIG. 6B. The entire spatial light modulation element 33 is driven by the element driving mechanism 34 to shift the pixel positions on the substrate 15 by Δx as a whole. Alternatively, the mold 14 may be driven by the mold driving unit 21 to shift the position of the mold 14 by Δx, or both the spatial light modulation element 33 and the mold 14 may be driven. As described above, the mold driving unit 21 can adjust the position of the pattern formation area of the mold and the position of the pattern light by changing the overall position of the mold 14 with respect to the imprint apparatus 1.

In step S105, the substrate 15 is conveyed from the outside of the imprint apparatus 1 to the substrate holding unit 24 (substrate stage 4) using the substrate transfer unit.

In step S106, the imprint material 16 is applied (supplied) onto a shot area formed on the substrate 15 conveyed in step S105. The stage driving unit 25 is driven so that a target shot area of the substrate 15 comes below the jetting unit 5, and the imprint material 16 is applied onto the shot area of the substrate 15.

In step S107, the imprinting process is performed to bring the imprint material 16 on the shot area of the substrate 15 into contact with the pattern part 19 of the mold 14. In step S106, the stage driving unit 25 is driven so that the shot area of the substrate 15 to which the imprint material 16 has been supplied comes below the mold 14. After that, the imprint apparatus 1 drives the mold driving unit 21 while adjusting the pressure in the space surrounded by the opening 22, the mold 14, and the light transmission element 23 to bring the pattern part 19 of the mold 14 into contact with the imprint material 16 in the shot area of the substrate 15.

In step S108, the pattern light 30 is applied. The pattern light 30 may be light having a wavelength that cures the imprint material 16 or light having a wavelength that does not cure the imprint material 16. The light having a wavelength that cures the imprint material 16 is applied to the outer periphery of the pattern part 19 to increase the viscosity of the imprint material 16 that is about to extrude outside the area of the pattern part 19 during the imprinting process executed in step S107. The light having a wavelength that does not cure the imprint material 16 is applied to the shot area formed on the substrate 15 and its periphery to thermally deform the shot area on the substrate 15.

In step S109, the substrate 15 and the mold 14 are aligned. The alignment measurement unit 9 measures the relative positions of the alignment marks formed on the substrate 15 and the mold 14. Based on the measurement result of the alignment marks, one or both of the stage driving unit 25 and the mold driving unit 21 are driven to align the substrate 15 and the mold 14. At this time, the entire position of the plurality of pixels included in the spatial light modulation element 33 may be adjusted by driving the element driving mechanism 34 according to the driving amount of the mold driving unit 21.

In step S110, the imprint material 16 on the substrate 15 is cured. The imprint apparatus 1 forms a pattern by curing the imprint material 16 through application of the curing light 18 by the curing light irradiation unit 2 in a state in which the imprint material 16 on the substrate 15 and the mold 14 are in contact with each other.

Step S104 can be performed in parallel with steps S105 to S110. Step S108 can be performed in parallel with step S109 and step S110.

In step S111, the mold 14 is separated from the cured imprint material 16 (releasing). In step S111, the mold 14 is separated from the cured imprint material 16 by widening the gap between the mold 14 and the substrate 15, after the imprint material 16 is cured in step S110. Alternatively, the mold 14 can be released from the substrate 15 by driving the mold driving unit 21 while adjusting the pressure in the space surrounded by the opening 22, the mold 14, and the light transmission element 23.

In step S112, it is confirmed whether pattern formation is completed in the shot area formed on the substrate 15. If there is any shot area on the substrate 15 where no pattern is formed (NO in step S112), the processing returns to step S106 to perform again the imprinting process (steps S106 to S111). If the pattern of the imprint material 16 is formed in all the shot areas formed on the substrate 15 (YES in step S112), the processing proceeds to step S113.

In step S113, the substrate 15 is carried out of the imprint apparatus 1 from the substrate holding unit 24 (substrate stage 4) using the substrate conveyance unit. In a case of forming a pattern by the imprinting process on a new substrate after carrying out of the substrate in step S113, the process can be started from step S105.

As described above, the imprint apparatus 1 according to the present exemplary embodiment can adjust the relative positions of the spatial light modulation element 33 and the mold 14, based on the measurement result of the position of the mold 14 (pattern part 19) and the measurement result of the position of the pixels formed in the spatial light modulation element 33. Thus, the pattern light 30 formed by the spatial light modulation element 33 can be applied to a target area of the mold 14 or the substrate 15.

Next, relative alignment between the mold 14 and the spatial light modulation element 33 of the second exemplary embodiment will be described. Of the steps of the imprinting process according to the present exemplary embodiment, steps other than step S104 are the same as the imprinting process of the first exemplary embodiment. Thus, step S104, which is different from the first exemplary embodiment, will be described in detail below in the present exemplary embodiment.

In step S104 of the present exemplary embodiment, the irradiation position or light intensity of the pattern light 30 formed by the spatial light modulation element 33 is changed corresponding to the positions of the pixels in the spatial light modulation element 33 measured in step S101 and the position of the side surface of the pattern part 19 measured in step S103.

Figure 7A:
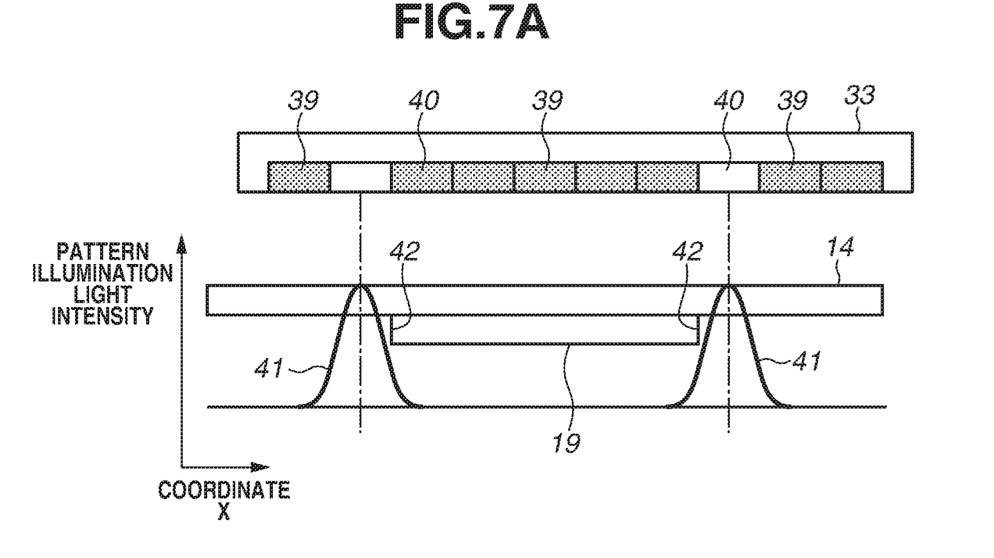
FIGS. 7A and 7B are diagrams illustrating irradiation pattern control of a mold and a spatial light modulation element according to a second exemplary embodiment.
Figure 7B:
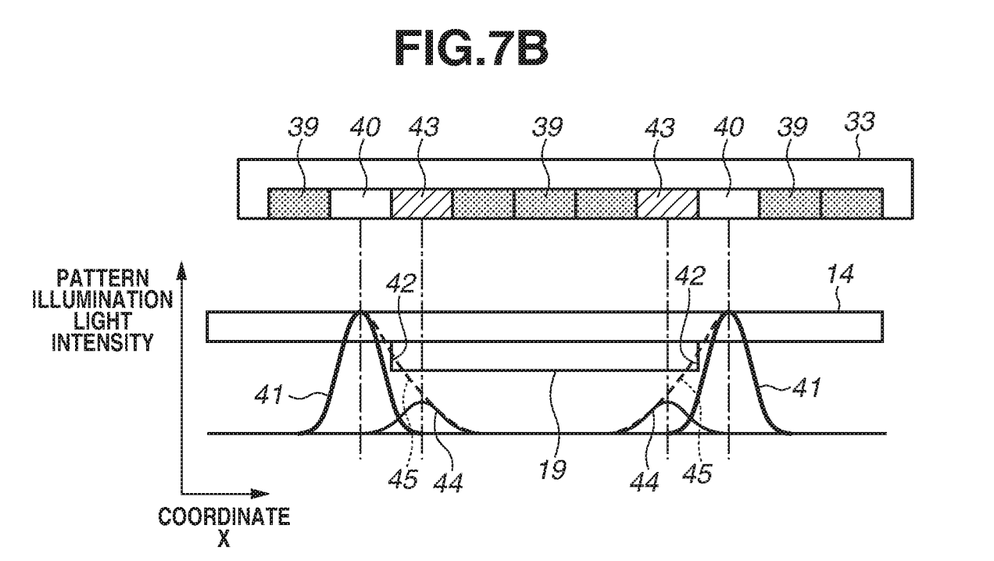

FIGS. 7A and 7B are schematic diagrams for explaining alignment between the mold 14 and the spatial light modulation element 33 performed in step S104 of the present exemplary embodiment. In the present exemplary embodiment, the positions of OFF pixels 39 and the ON pixels 40 in the spatial light modulation element 33 are switched when the positional relationship between the mold 14 conveyed to the mold holding unit in step S102 and the pixels in the spatial light modulation element 33 is in the state illustrated in FIG. 6A. Further, in the present exemplary embodiment, the intensity of the irradiation light from the spatial light modulation element 33 is adjusted to adjust the intensity of the light applied to the end surfaces 42 (target positions) of the pattern part 19. For example, the positions of OFF pixels 39 and the ON pixels 40 formed in the spatial light modulation element 33 are switched such that the intensity distributions of the pattern light 30 applied to the end surfaces 42 of the pattern part 19 become equal, as composite intensity distributions 45 illustrated in FIG. 7B indicate.

A method for adjusting the intensity distribution of the pattern light 30 will be described with reference to FIGS. 7A and 7B. In a case where the positional relationship between the mold 14 conveyed to the mold holding unit in step S102 and the pixels in the spatial light modulation element 33 is in the state illustrated in FIG. 6A, the position of one of the two ON pixels 40 is switched as illustrated in FIG. 7A. In the present exemplary embodiment, the position of the ON pixel 40 in the spatial light modulation element 33 irradiating the end surface 42 of the pattern part 19 located in a −X direction is shifted by one pixel in the −X direction. Thereby, it is understandable that the intensity distributions 41 of the pattern light 30 are equally formed on the end surfaces 42 of the two pattern parts 19 illustrated in FIG. 7A.

FIG. 7B illustrates a method of changing the illumination area and light intensity of the pattern light 30. Referring to FIG. 7B, pixels 43 with a shortened ON time are disposed adjacent to the ON pixels 40 inside the pattern part 19 (shot region). For example, when the ON pixels 40 are ON (e.g., applying the pattern light 30 to the substrate 15) for 100 msec., the pixels 43 are ON for 20 msec. The intensity distributions 41 of the pattern light 30 formed by the ON pixels 40 and an intensity distributions 44 of the pattern light 30 formed by the pixels 43 are combined, and the pattern light 30 having the composite intensity distributions 45 are applied on the substrate 15.

As described above, the imprint apparatus 1 according to the present exemplary embodiment can adjust the illumination area and light intensity of the pattern light 30 emitted by the spatial light modulation element 33, based on the measurement result of the position of the mold 14 (pattern part 19) and the measurement result of the position of the pixels in the spatial light modulation element 33. Accordingly, the pattern light 30 formed by the spatial light modulation element 33 and adjusted in light intensity can be applied to a required area of the mold 14 or the substrate 15.

The method according to the present exemplary embodiment can suppress the extrusion of the imprint material by adjusting the intensity of the irradiation light emitted from the light source 31 of the pattern light irradiation unit 6, even if the positions of the spatial light modulation element 33 and the pattern part 19 of the mold 14 are shifted from each other.

The imprint apparatus 1 has been described in relation to the imprinting method for curing an imprint material using the light curing method. However, the present exemplary embodiment is not limited to the light curing method and may employ a heat curing method. The light curing method, which uses an ultraviolet curable resin to form a pattern, cures the resin by applying ultraviolet rays in a state in which the mold is pressed against the substrate through the resin, and then separates the mold from the cured resin. In the present exemplary embodiment, ultraviolet rays are applied as the curing light, but the wavelength of the light can be appropriately determined according to an imprint material supplied onto the substrate. On the other hand, a method with heat application, heats the thermoplastic resin to a temperature higher or equal to the glass transition temperature, presses the mold against the substrate through the resin in a state in which the fluidity of the resin is increased, cools the resin, and then separates the mold from the resin to form a pattern.

(Manufacturing Method of Article)

The pattern of the cured material formed by the imprint apparatus is used permanently for at least a part of various articles, or is temporarily used at the manufacture of various articles. The articles include electric circuit elements, optical elements, micro electro mechanical systems (MEMS), recording elements, sensors, and molds. Examples of the electric circuit elements include volatile or nonvolatile semiconductor memories such as dynamic random-access memories (DRAM), static random access memories (SRAM), flash memories, and magnetic random access memories (MRAM), and semiconductor elements such as large scale integrated circuits (LSI), charge-coupled devices (CCD), image sensors, and field programmable gate arrays (FPGA). Examples of the mold include molds for imprinting.

The pattern of the cured material is used as it is as a component of at least a part of the article, or is temporarily used as a resist mask. In the substrate processing, the resist mask is removed after etching, ion implantation, or the like.

Figure 8A:
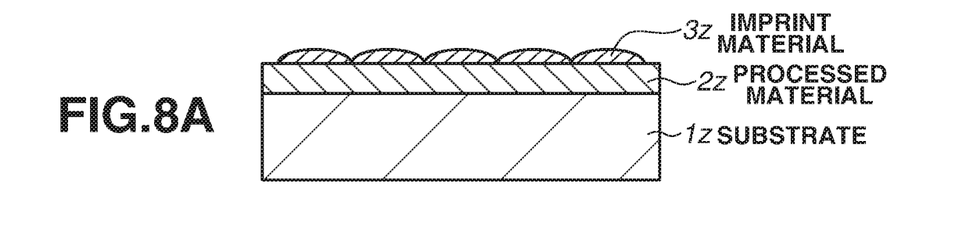
FIGS. 8A to 8F are diagrams for explaining a manufacturing method of an article.

Next, a specific manufacturing method of an article will be described. As illustrated in FIG. 8A, a substrate 1z is prepared. On the substrate 1z, a workpiece material 2z such as an insulating material is formed. An imprint material 3z is then applied on the surface of the workpiece material 2z by an inkjet method or the like. FIG. 8A illustrates a state in which the imprint material 3z in a form of a plurality of droplets is applied on the substrate.

Figure 8B:
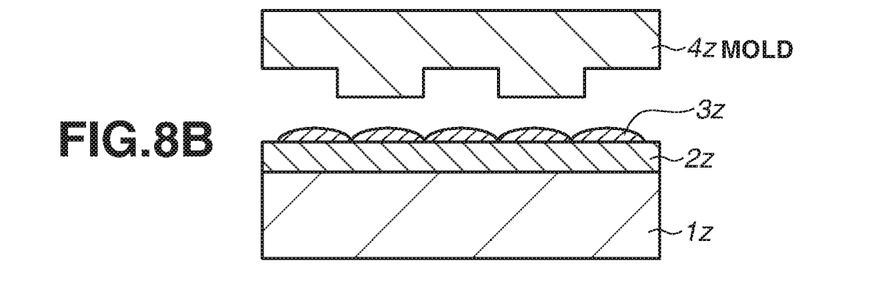
Figure 8C:
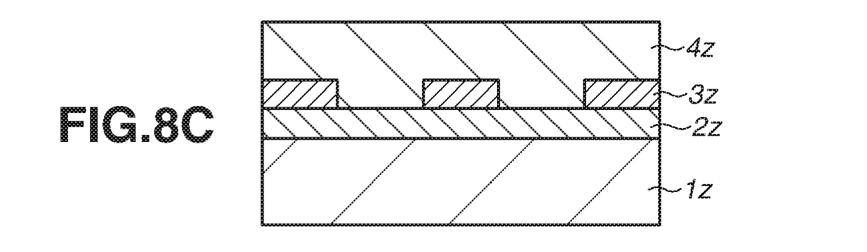

As illustrated in FIG. 8B, an imprint mold 4z is positioned such that the side with a concave-convex pattern is opposed to the imprint material 3z on the substrate. As illustrated in FIG. 8C, the substrate 1z provided with the imprint material 3z and the mold 4z are brought into contact with each other, and pressure is applied. The imprint material 3z is filled in the gap between the mold 4z and the workpiece material 2z. In this state, light is applied as curing energy through the mold 4z, and the imprint material 3z becomes cured.

Figure 8D:
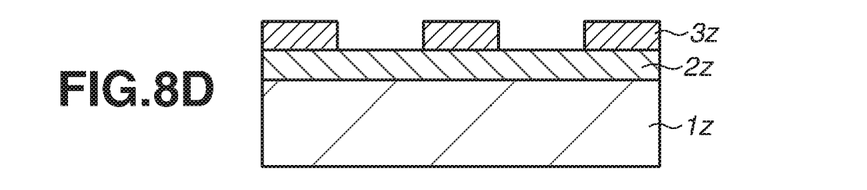

As illustrated in FIG. 8D, after the imprint material 3z has been cured, the mold 4z and the substrate 1z are separated, and a cured material pattern of the imprint material 3z is formed on the substrate 1z. This cured material pattern has a shape in which the concave portion of the mold corresponds to the convex portion of the cured material, and the convex portion of the mold corresponds to the concave portion of the cured material. In other words, the concave-convex pattern of the mold 4z is transferred to the imprint material 3z.

Figure 8E:
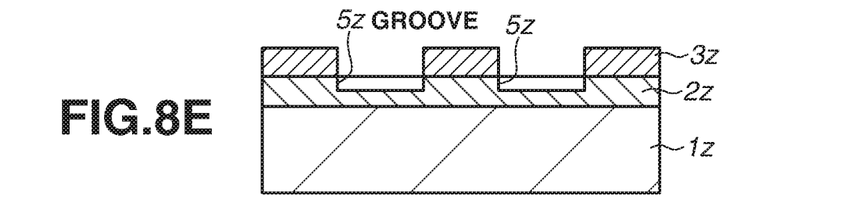
Figure 8F:
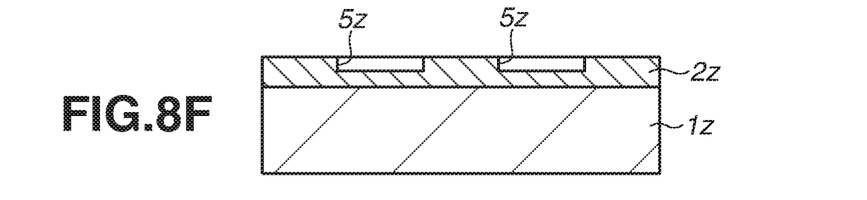

As illustrated in FIG. 8E, when etching is performed using the pattern of the cured material as an etching resistant mask, portions of the surface of the workpiece material 2z where the cured material is not present or remains thin are removed to form grooves 5z. As illustrated in FIG. 8F, when the pattern of the cured material is removed, an article with the grooves 5z formed on the surface of the workpiece material 2z can be obtained. In this example, the cured material pattern is removed. Alternatively, the cured material pattern may not be removed after the processing but may be used, for example, as a film for inter-layer insulation included in the semiconductor device, that is, as a constituent element of the article.

Although preferable exemplary embodiments of the present invention have been described above, the present invention is not limited to these exemplary embodiments. Various modifications and changes can be made within the gist of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-047613, filed Mar. 14, 2019, which is hereby incorporated by reference herein in its entirety.

What is claimed is:

1. An imprint apparatus that forms a pattern of an imprint material on a substrate using a mold having a pattern formation area, the imprint apparatus comprising:
    a mold measurement unit configured to measure a position of the pattern formation area of the mold;
    a light modulation element configured to control an intensity distribution of irradiation light applied to the substrate by modulating the irradiation from a light source;
    an irradiation light measurement unit configured to measure a position of the irradiation light;
    a control unit configured to control the position of the irradiation light with respect to the position of the pattern formation area based on a measurement result of the position of the pattern formation area by the mold measurement unit and a measurement result of the position of the irradiation light by the irradiation light measurement unit; and
    an element driving mechanism configured to move a position of the light modulation element,
    wherein the control unit controls the element driving mechanism to move the position of the light modulation element with respect to the light source to control the position of the irradiation light.

2. The imprint apparatus according to claim 1, wherein the control unit determines relative positions of the pattern formation area of the mold and the irradiation light using the measurement result by the mold measurement unit and the measurement result by the irradiation light measurement unit and controls the position of the irradiation light to align the relative positions.

3. The imprint apparatus according to claim 1, further comprising a mold driving unit configured to drive the mold, wherein the control unit controls the mold driving unit and changes a position of the mold with respect to the imprint apparatus to control the position of the irradiation light with respect to the position of the pattern formation area.

4. The imprint apparatus according to claim 1, wherein the mold measurement unit measures the position of the pattern formation area by measuring a distance to the pattern formation area of the mold in a state where the mold is held by a mold holding unit.

5. The imprint apparatus according to claim 4,
    wherein the mold measurement unit is provided in a substrate holding unit configured to hold the substrate, and
    wherein scanning is performed by the substrate holding unit in a direction along the pattern formation area of the mold, and the mold measurement unit measures the position of the pattern formation area by measuring the distance to the pattern formation area.

6. The imprint apparatus according to claim 1, wherein the mold measurement unit measures a position of a side surface of the mold to measure the position of the pattern formation area of the mold.

7. The imprint apparatus according to claim 1,
    wherein the irradiation light measurement unit is provided in a substrate holding unit configured to hold the substrate, and
    wherein the irradiation light measurement unit measures an illumination area of the irradiation light applied to the substrate by scanning with the substrate holding unit in a direction along a surface of the substrate.

8. An imprinting method for forming a pattern of an imprint material on a substrate using a mold having a pattern formation area, the imprinting method comprising:
    measuring a position of the pattern formation area of the mold;
    measuring a position of irradiation light from a light modulation element that controls an intensity distribution of the irradiation light applied to the substrate by modulating the irradiation light from a light source; and
    adjusting the position of the irradiation light with respect to the position of the pattern formation area by controlling an element driving mechanism to move a position of the light modulation element with respect to the light source, based on a result of measurement of the position of the pattern formation area in the measuring of the position of the pattern formation area of the mold and a result of measurement of the position of the irradiation light in the measuring of the position of the irradiation light.

9. A manufacturing method of an article, comprising:
    molding a composition on a substrate using the imprint apparatus according to claim 1; and
    processing the substrate on which the composition is formed in the molding.

10. The imprint apparatus according to claim 1, wherein the control unit controls the element driving mechanism to move the position of the light modulation element in the directing along the surface of the light modulation element.

* * * * *